United States Patent
Hübner et al.

[19]

[11] Patent Number: 5,969,534
[45] Date of Patent: *Oct. 19, 1999

[54] SEMICONDUCTOR TESTING APPARATUS

[75] Inventors: Holger Hübner, Baldham; Werner Weber, München; Siegmar Köppe, Laatzen; Helmut Klose, München, all of Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/666,491
[22] PCT Filed: Jan. 9, 1995
[86] PCT No.: PCT/DE95/00013
  § 371 Date: Jul. 11, 1996
  § 102(e) Date: Jul. 11, 1996
[87] PCT Pub. No.: WO95/18975
  PCT Pub. Date: Jul. 13, 1995

[30] Foreign Application Priority Data

Jan. 11, 1994 [DE] Germany .............................. 44 00 551

[51] Int. Cl.⁶ .................................................. G01R 31/02
[52] U.S. Cl. ........................................... 324/757; 439/179
[58] Field of Search .................................. 324/754–758, 324/765; 439/178, 179

[56] References Cited

U.S. PATENT DOCUMENTS

| | | |
|---|---|---|
| 2,947,939 | 8/1960 | Harwig ..................................... 324/722 |
| 4,409,546 | 10/1983 | Shulman . |
| 4,521,730 | 6/1985 | Shulman ................................. 324/754 |
| 4,585,991 | 4/1986 | Reid et al. ............................... 324/757 |
| 4,833,402 | 5/1989 | Boegh-Petersen ....................... 324/754 |
| 5,258,648 | 11/1993 | Lin . |
| 5,358,417 | 10/1994 | Schmedding ............................ 439/178 |
| 5,585,736 | 12/1996 | Hshieh et al. ........................... 324/754 |

FOREIGN PATENT DOCUMENTS 24 40 305   11/1975   Germany .
2 247 565   3/1992   United Kingdom .

OTHER PUBLICATIONS

IBM Technical Disclosure Bulletin, "Burn–in/In Situ Testing of Computer Chips", vol. 36, No. 03, Mar. 1993, pp. 229–231.

*Primary Examiner*—Josie Ballato
*Assistant Examiner*—Russell M. Kobert
*Attorney, Agent, or Firm*—Hill & Simpson

[57] ABSTRACT

A method and apparatus for the reversible contacting of a semiconductor circuit level to assist in performing a function test. The apparatus includes a testing head having test points arranged at a test side lying opposite the contact surfaces of a semiconductor circuit level. The test points are formed of liquid contacts in recesses in the test side of the testing head wherein the liquid contacts form menisci that project beyond the surface of the testing head. The recesses, in turn, are provided for metallizations which are connected to electrically-conductive leads. In addition, the surface may be provided with a roughening or with etched trenches.

8 Claims, 1 Drawing Sheet

SEMICONDUCTOR TESTING APPARATUS

BACKGROUND OF THE INVENTION

1. Field of the Invention

The present invention is directed both to an apparatus for the reversible contacting of a semiconductor circuit level to assist in performing a function test and to a method for testing semiconductor circuit levels upon employment of such an apparatus.

2. Description of the Prior Art

Semiconductor circuits are currently manufactured using planar circuit technology. The complexity that can be achieved on a single chip is limited by the chip's size and structural fineness. Given conventional technology, the performance capability of a system composed of a plurality of semiconductor chips connected to one another is essentially limited by: the number of possible connections between individual chip's terminal contacts (pads); the low speed of the signal transmission via such connections between various chips; the limited speed through highly-branched interconnects on complex chips; and the high power consumption of interface circuits.

These limitations which are associated with planar technology can be overcome with three-dimensional interconnection techniques. The arrangement of function levels, one above another, allow a parallel communication between components with little outlay of electrically-conductive connections in a single level (also referred to as "cubically-integrated") Further, speed-limiting interchip connections may be avoided. Such a cubically-integrated semiconductor chip may still be accommodated in a single housing despite its enhanced functionality.

To avoid unnecessary losses in the yield of functional chips, only those circuit levels which have been tested and found to be fully functional are placed above one another and contacted. Such arrangement is unproblematic as long as the circuit levels are "self-sufficient," i.e., independently-functioning circuits. With self-sufficient circuits, it is possible to test them after they are connected to a wafer, yet before they are passivated, separated and mounted in housings. When, however, a circuit level only functions when interacting with its vertically-neighboring circuit levels, the testing of such circuit level is only possible after the irreversible assembly of the various other circuit levels. This process should be avoided, however, because it drastically reduces the obtainable yield.

For testing purposes, the circuits are usually contacted by placing fine test probes onto the bond pads. However, the pads have significantly larger dimensions than the connection contacts of the circuit levels that are provided for the cubic integration. In addition, the number of contacts is significantly great (about 10,000 through 100,000). As a result of both the fine dimensions and the great number of contact locations, the use of standard test probes is precluded.

Another testing method employs electron-optical methods. This method, however, requires self-sufficient circuit levels, a prerequisite that, as already mentioned, is not met with cubic integration. Further, the voltage supply may not be assured, particularly given insulated circuit levels. In sum, these testing methods cannot be employed for testing individual semiconductor circuit levels that are provided for cubic integration.

An object of the present invention, therefore, is to provide semiconductor circuit levels, especially those having non-self-sufficient circuits, which can be subjected to a function test before their cubic integration.

SUMMARY OF THE INVENTION

This object is achieved in an apparatus for the reversible contacting of a semiconductor circuit level wherein the apparatus includes a testing head having an essentially planar upper side and a plurality of recesses arranged in a test side at locations which provide for contact with the semiconductor circuit level. The apparatus further includes a plurality of test points formed by liquid contacts located in the plurality of recesses in the test side of the testing head such that a free surface of the liquid contacts projects beyond the test side.

The object is further achieved in a method of testing semiconductor circuit levels before cubic integration wherein the method includes the steps of: providing an apparatus for the reversible contacting of the semiconductor circuit level (as described above); providing a lead for an electrode connection to the test points; contacting one of the contact surfaces of the semiconductor circuit level with the test point; and removing the semiconductor circuit from the apparatus after performing the function test.

Pursuant to the present invention, the reversible contacting of a semiconductor circuit level is realized in such a way that liquid contacts are installed at the locations which are provided for the contacting in a testing head. The semiconductor circuit level that is to be tested can therefore be brought into contact with this testing head wherein the electrical connection for the function test may be made via the liquid contacts of the testing head with connected, conductive connections. A great number of such contacts may be easily manufactured in a very small space and pursuant to the minutest individual dimensions. The testing head can then have contacts for various circuit levels such that the same testing head can be used for testing various circuit levels provided for cubic integration. The individual circuit level is reversibly connected to the testing head and can be separated therefrom without damage. In addition, the testing head can contain an integrated circuit with the logic required for the operation in testing of the appertaining circuit level.

The fundamental structure of the method and apparatus of the present invention is described in more detail in connection with the foregoing drawings.

DETAILED DESCRIPTION OF THE PREFERRED EMBODIMENTS

Figure 1:
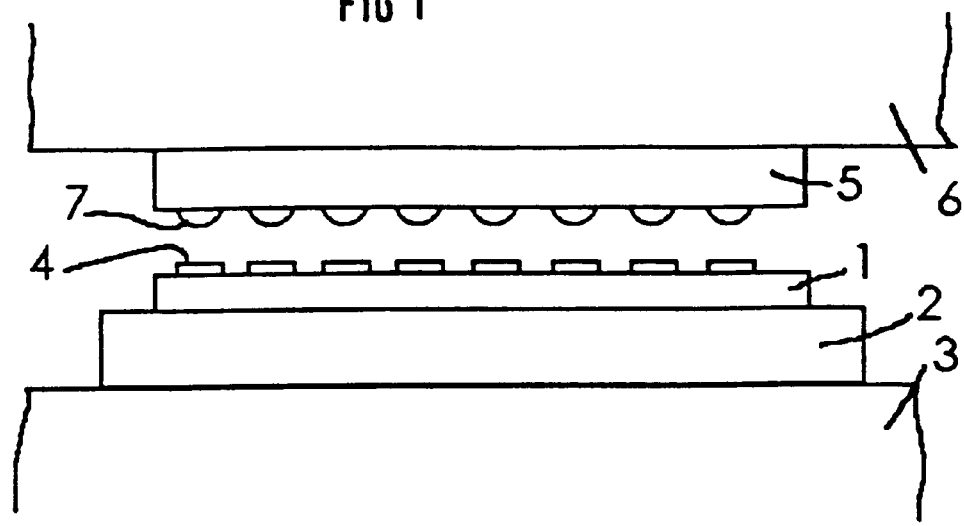
FIG. 1 shows the application of a testing head to a circuit level of the present invention.

Pursuant to the function test corresponding to the arrangement of FIG. 1, a circuit level 1 to be tested is firmly joined to a carrier plate 2 at its underside. The carrier plate 2 provided for both the mechanical stabilization of the thin circuit level 1 and the dissipation of heat into a heat sink 3 connected thereto. The contact surfaces 4 provided on the surface of circuit level 1 are prepared for testing for their vertical contacting to a further circuit level to be mounted thereabove. Testing head 5 of the present invention is advantageously coupled, for example, to a heat sink 6 and has its test points 7 directed toward the circuit level 1 under test. The test points 7 are respectively arranged opposite the contact surfaces 4 of the circle level 1 that are to be electrically connected. As mentioned, the testing head 5 can contain additional test points 7 to serve the purpose of testing further circuit levels. The test points 7 may be formed with thin-bodied, viscous or elastic material. Such materials shall be uniformly referred to as liquid contacts. How the test point 7 can be constructed with such liquid contacts may be seen from FIG. 2.

Figure 2:
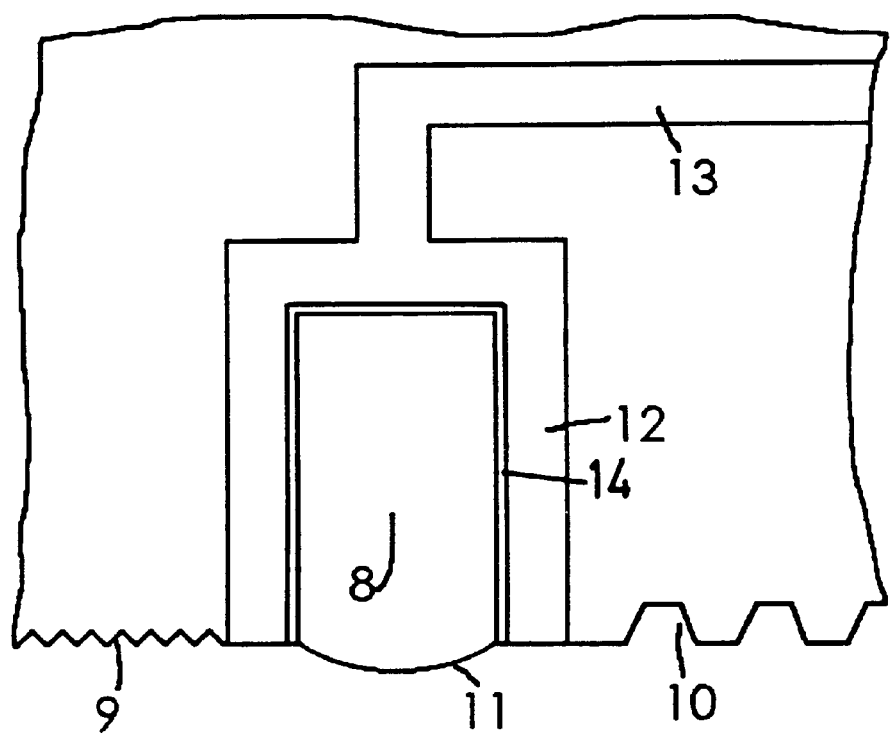
FIG. 2 shows a cross-sectional view of a contact of the testing head of the present invention.

FIG. 2 offers a cross-sectional view of a single test point 7 from the upper side of the testing head 5 provided for the connection to a circuit level. As shown in this example, this test point 7 is produced in a cylindrical recess in the upper side of the testing head 5. The walls of the cylindrical recess are covered with a metallization 12. An electrically-conductive lead 13 for the electrical connection of the appertaining test point 7 is conducted to this metallization 12. The liquid contact 8, whose surface forms an outwardly arched meniscus 11, is located in the inside of the recess.

The liquid contacts 8 and the metallization 12 must be manufactured of materials that are of such a nature that the metallization of the walls cannot dissolve in the material of the liquid contact 8 or be damaged due to chemical reactions therewith. On the other hand, the liquid contact 8 must wet the metallization 12 in order to assure good electrical contact. These preconditions are met, for example, when a metal having a low melting point is used for the liquid contacts 8, a metal that is standard in microelectronics is used for the metallization 12, and an electrically-conductive diffusion barrier 14 is applied between the two metals. For example, Ga may be used for the liquid contacts 8, Al or W may be used for the metallization 12, and TiN may be used for the diffusion barrier 14. Fundamentally, however, any desired electrically-conductive liquid may be used for the liquid contacts 8 (for example electrolyte, ferro-fluid or the like wherein a liquid metal like gallium is used as the metallization).

In an embodiment, the testing head 5 may be provided with magnetic metallizations 12. When an electrically-conductive ferrofluid (for example, an electrolyte with suspended magnetic particles) is used for the liquid contacts 8, the magnetic forces concentrate the drops of liquid onto the region of the contact surface 4. As such, a highly elastic, electrically-conductive plastic may be used for the liquid contacts 8 instead of a liquid. Such test contacts 7, with plastic projecting beyond the surface, yield resiliently to compensate for mechanical tolerances of the surface of circuit level and can be removed, residue-free, after the test. The testing method is thus simplified because a subsequent cleaning of the circuit level is not required and a contamination problem does not arise.

Given the use of plastic for the liquid contacts 8, the diffusion barrier 14 also can be omitted. The metallization 12 is also advantageous, but it too may be omitted when the electrically-conductive plastic is introduced into, for example, a recess in an adequately highly-doped region of the semiconductor material that surrounds this recess. Such embodiment would then correspond to that which is shown in FIG. 2 without the layers 12 and 14.

Generally, the test side of the testing head 5 of the present invention should not be too firmly connected to the upper side of the circuit level under test so that the circuit level does not break when releasing the connection to the testing head 5 after the test. One should therefore avoid having the two temporarily-joined surfaces exerting excessively high forces of adhesion upon one another. This can be ensured through the appropriate preparation of the test side of the testing head to be connected to the circuit level. One possibility, for example, is to make the test side uneven with a roughening 9 (see FIG. 2) or with etched trenches 10 such that the contact between the testing head 5 and the circuit level 1 occurs only at points on the surface. A reduction of the adhesive forces can also be achieved with a coating of the upper side of the testing head 5 with a suitable anti-adhesion layer placed between the test contacts 7.

The test side of the testing head 5 provided with the test point 7 should not be moistened by the electrically-conductive liquid of the liquid contacts 8 when contacting a circuit level because shorts could otherwise occur between the contacts. The introduction of the liquid into the recesses of the testing head 5 occurs, for example, by the sprinkling and subsequent spinning-off of the excess liquid residing on the surface. The menisci 11 shown in FIG. 2 thereby form the portion of the test points 7 which project beyond the upper side of the testing head 5 which are shown in FIG. 1. When the testing head 5 is turned over as shown in FIG. 1, the liquid contacts 8 hang down and are impeded from running out by the cohesion forces. The electrical contact upon approach of the testing head 5 to the circuit level under test then occurs as the liquid moistens the contact surfaces 4. Since the liquid contacts 8 project beyond the surface of the testing head 5, a compensation for the irregularities in the surface of the circuit level under test is achieved upon contact. Such compensation is similar to that which would be achieved by the resilient bearing of the test probes given mechanical contacts.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the hereinafter appended claims.

We claim:

1. An apparatus for the reversible contacting and testing of a semiconductor circuit level, comprising:

a testing head having a substantially planar test side and a plurality of recesses arranged in the test side at locations provided for a contacting with a plurality of individual contact surfaces of the semiconductor circuit level, the testing head further including means for reducing adhesion between the semiconductor circuit level and the testing head;

a plurality of electrically-conductive leads in the testing head, each lead being connected to one of the plurality of metallization areas;

an integrated circuit arranged in the testing head, the integrated circuit including logic required for testing the semiconductor circuit level; and a plurality of test points formed by liquid contacts respectively located within the plurality of recesses such that a free surface of each liquid contact projects from its respective recess beyond the planar test side so as to contact a single contact surface of the semiconductor circuit level.

2. The apparatus as claimed in claim 1, wherein the liquid contacts are a liquid metal.

3. The apparatus as claimed in claim 2, wherein the liquid metal is gallium.

4. The apparatus as claimed in claim 1, wherein the liquid contacts are an electrically-conductive ferro-fluid and the plurality of metallization areas are magnetic.

5. The apparatus as claimed in claim 1, wherein the liquid contacts are highly elastic, electrically-conductive plastic.

6. The apparatus as claimed in claim 1, wherein the means for reducing adhesion comprises a roughening area between the test points on the test side of the testing head.

7. The apparatus as claimed in claim 1, wherein the means for reducing adhesion comprises an anti-adhesion layer between the test points on the test side of the testing head.

8. The apparatus as claimed in claim 1, wherein the means for reducing adhesion comprises an anti-adhesion layer between the test points on the test side of the testing head.

* * * * *